United States Patent
Mikalo et al.

(10) Patent No.: US 9,324,654 B2
(45) Date of Patent: Apr. 26, 2016

(54) INTEGRATED CIRCUITS WITH ELECTRONIC FUSE STRUCTURES

(71) Applicant: GLOBALFOUNDRIES, Inc., Grand Cayman (KY)

(72) Inventors: Ricardo Mikalo, Heideblick (DE); Andreas Kurz, Dresden (DE); Alexandru Romanescu, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/459,607

(22) Filed: Aug. 14, 2014

(65) Prior Publication Data

US 2016/0049366 A1 Feb. 18, 2016

(51) Int. Cl.
*H01L 23/52* (2006.01)
*H01L 23/525* (2006.01)
*H01L 27/102* (2006.01)
*H01L 23/62* (2006.01)
*H01L 27/112* (2006.01)

(52) U.S. Cl.
CPC ............ *H01L 23/5256* (2013.01); *H01L 23/62* (2013.01); *H01L 27/1026* (2013.01); *H01L 27/11206* (2013.01)

(58) Field of Classification Search
CPC .............. H01L 23/5256; H01L 123/62; H01L 27/1026; H01L 27/11206
USPC .......................................... 257/529; 438/601
See application file for complete search history.

(56) References Cited

U.S. PATENT DOCUMENTS

2012/0306048 A1* 12/2012 Li .......................... G11C 17/16
257/529
2014/0264731 A1* 9/2014 Kim ..................... H01L 23/345
257/529

\* cited by examiner

*Primary Examiner* — Yasser A Abdelaziez
*Assistant Examiner* — Hajar Kolahdouzan
(74) *Attorney, Agent, or Firm* — Ingrassia Fisher & Lorenz, P.C.

(57) ABSTRACT

Integrated circuits including electronic fuse structures are disclosed. In some examples, the electronic fuse structure includes a fuse part and first and second pre-heating lines positioned generally parallel to and co-planar with the fuse part, and electrically connected with the fuse part. The electronic fuse structure also includes a cathode physically and electrically connected to the first pre-heating line and an anode physically and electrically connected to the second pre-heating line.

16 Claims, 3 Drawing Sheets

INTEGRATED CIRCUITS WITH ELECTRONIC FUSE STRUCTURES

TECHNICAL FIELD

The present disclosure generally relates to integrated circuits. More particularly, the present disclosure relates to integrated circuits with electronic fuse structures.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

In such modern integrated circuits, the reliability and performance of certain circuit portions may be determined by material characteristics and process techniques for forming highly sophisticated circuit elements, while other circuit portions may used to form less critical devices, which may thus provide a different behavior over the lifetime compared to critical circuit portions. Consequently, the combination of the various circuit portions in a single semiconductor device may result in a significantly different behavior of the device with respect to performance and reliability, wherein the variations of the overall manufacturing process flow may also contribute to a further discrepancy between the various circuit portions.

For these reasons, in complex integrated circuits, additional mechanisms may be implemented so as to allow the circuit itself to adapt the performance of certain circuit portions to comply with the performance of other circuit portions. This adaptation may be necessary upon completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, resetting overall circuit speed, and the like.

For this purpose, so-called electronic fuses, or "e-fuses," may be provided in the semiconductor devices. E-fuses represent electronic switches that are activated once in order to provide a desired circuit adaptation. Hence, the electronic fuses are considered as having a high impedance state, which typically also represent a "programmed" state, and have a low impedance state, typically representing a non-programmed state of the electronic fuse. Because these electronic fuses are actuated once over the lifetime of the semiconductor device under consideration, a corresponding programming activity has to ensure that a desired programmed state of the electronic fuse is reliably generated in order to provide well-defined conditions for the further operational lifetime of the device. Activation of the e-fuse typically involves passing a relatively high current through the fuse which, given the relatively high resistance of the structure, causes the e-fuse to at least partially physically and structurally disintegrate, or as is commonly referenced in the literature, to "blow."

Current e-fuses are executed in one wiring level only. To obtain sufficient resistance in order to reliably ensure the appropriate programming state, the e-fuse lengths are relatively long, which undesirably results in a large area "foot print" on the integrated circuit. Furthermore, in order to have a sufficiently-high resistance, minimum e-fuse widths are used, which in some prior art methods may be stabilized by lithographic but electrically inactive support lines. These support lines also consume extra foot print area without providing any functional purpose with regard to the e-fuse.

Accordingly, it is desirable to provide improved integrated circuits that include e-fuses with a reduced footprint area on the integrated circuit. It further is desirable to provide such integrated circuits that avoid the need for electrically inactive support lines. Still further, it is desirable to provide such integrated circuits having e-fuses with a high degree of reliability. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits that include electronic fuse structures are disclosed. In one exemplary embodiment, an electronic fuse structure includes a fuse part and first and second preheating lines positioned generally parallel (i.e., within about 20 degrees of parallel) to and co-planar with the fuse part, and electrically connected with the fuse part. The electronic fuse structure also includes a cathode physically and electrically connected to the first pre-heating line and an anode physically and electrically connected to the second pre-heating line.

In another exemplary embodiment, an integrated circuit structure includes a semiconductor substrate, an active circuit device disposed on the semiconductor substrate, and a first wiring level overlying the active circuit device. The first wiring level includes an electronic fuse structure that includes a fuse part, first and second pre-heating lines positioned generally parallel to and co-planar with the fuse part, and electrically connected with the fuse part, a cathode physically and electrically connected to the first pre-heating line, and an anode physically and electrically connected to the second pre-heating line.

In yet another exemplary embodiment, an electronic fuse structure disposed on an integrated circuit includes a fuse part positioned in a first wiring level of the integrated circuit and first and second pre-heating lines positioned generally parallel to and co-planar with the fuse part in the first wiring level, and electrically connected with the fuse part. Each of the first and second pre-heating lines has a width that is greater than the fuse part. The electronic fuse further includes first and second connecting portions physically and electrically connecting the first and second pre-heating lines in the first wiring level, respectively, to the fuse part. The first and second connecting portions are oriented generally perpendicular (i.e., within about 20 degrees of perpendicular) to the first and second pre-heating lines and the fuse part. The electronic fuse further includes third and fourth pre-heating lines positioned generally parallel to and co-planar with the fuse part and positioned in second and third wiring levels of the integrated circuit, respectively, and electrically connected with the fuse part. The first and second pre-heating lines are not coplanar with the third and fourth pre-heating lines, and each of the third and fourth pre-heating lines has a width that is greater than the fuse part. The electronic fuse further includes third and fourth connecting portions physically and electrically connecting the third and fourth pre-heating lines, respectively, in the second and third wiring levels of the integrated circuit, respectively, to the fuse part. The third and fourth connecting portions are oriented generally perpendicular to the first, second, third, and fourth pre-heating lines and the fuse part. Still further, the electronic fuse includes a cathode physically and electrically connected to the third pre-heating line and an anode physically and electrically connected to the fourth pre-heating line.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure provides embodiments of integrated circuits that include e-fuses. The disclosed e-fuses have a smaller length than conventional e-fuses, and do not include inactive support structures. Rather, the disclosed integrated circuit structures employ an e-fuse pre-heating arrangement in the proximity of the e-fuse in order to ensure sufficient reliability given the smaller length. The e-fuse pre-heating arrangement may be provided in the form of active support lines in the proximity of the e-fuse, for example, on either side of the e-fuse, or above or below the e-fuse. The pre-heating arrangement serves two functions: (1) it supports the lithographic process for the patterning of the e-fuse (which as noted above has previously been performed by inactive support lines); and (2) it provides heat to the e-fuse, which in turn allows for a sufficient increase of total resistance in the e-fuse to cause the e-fuse to blow when desired. As such, e-fuses with a reduced footprint area but with consistent reliability may be realized.

For the sake of brevity, conventional techniques related to integrated circuit device fabrication may not be described in detail herein. As noted above, the e-fuse structures may be implemented in one or more of the wiring levels of the integrated circuit, and as such the illustrated embodiments are set forth with regard integrated circuits at a stage of fabrication wherein one or more active circuit devices, such as transistors, resistors, and the like, have been previously formed using techniques know in the art. Because the described e-fuse structures are not limited to any particular configuration of active circuit devices, such devices are not illustrated herein in any detail. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
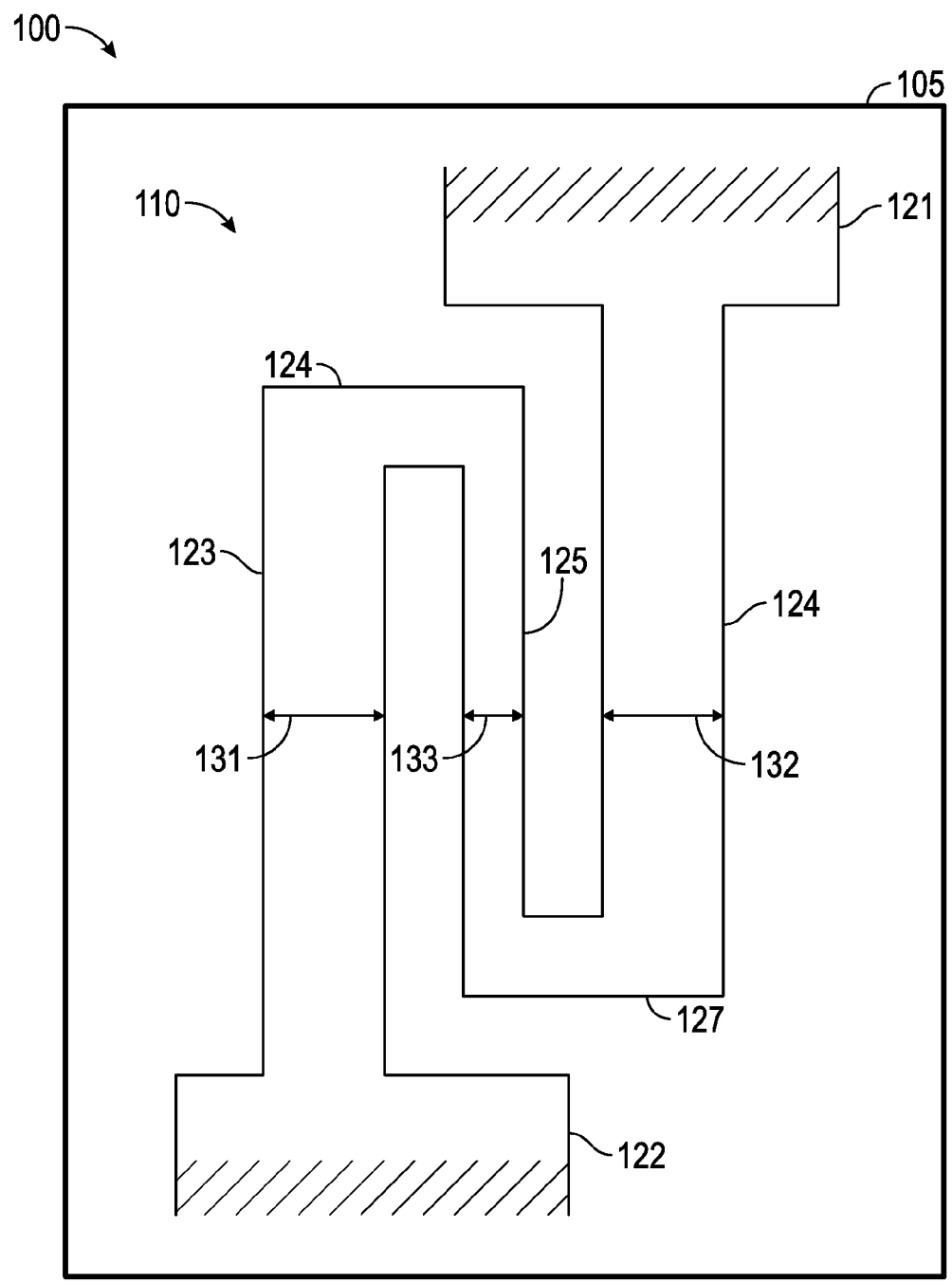
FIG. 1 provides a top view of an e-fuse structure fabricated on an integrated circuit in accordance with one embodiment of the present disclosure.

FIG. 1 illustrates an e-fuse structure 110 fabricated on an integrated circuit 100 in accordance with one embodiment of the present disclosure. The integrated circuit 100 includes an active circuit area 105, over which the e-fuse structure is disposed. As noted above, the active circuit area 105 may include transistors, resistors, and the like, disposed over a semiconductor substrate. Briefly, the semiconductor substrate is defined to mean any construction formed of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate may further include a plurality of isolation features (not shown), such as shallow trench isolation (STI) features or local oxidation of silicon (LOCOS) features. The isolation features may define and isolate the various microelectronic elements (not shown), also referred to herein as active integrated circuit structures. Examples of the various microelectronic elements that may be formed in the substrate include transistors (e.g., metal oxide semiconductor field effect transistors (MOSFET), complementary metal oxide semiconductor (CMOS) transistors, bipolar junction transistors (BJT), high voltage transistors, high frequency transistors, etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The active circuit area 105 may further include disposed thereover non-illustrated inter-layer dielectric layers and a metallization structure overlying the active integrated circuit structures, of which the illustrated e-fuse 110 forms a portion. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure, such as last metal layer 110, may include copper or copper alloys. One skilled in the art will realize the formation details of the metallization structure.

Turning now to the configuration of the exemplary e-fuse 110 shown in FIG. 1, the e-fuse structure includes a cathode 121, an anode 122, first and second pre-heating lines 123 and 124, a fuse part 125, and first and second connection portions 126 and 127. First and second pre-heating lines 123 and 124 may be provided in a generally parallel and coplanar arrangement with respect to the fuse part 125, with the fuse part 125 being disposed between the first and second pre-heating lines 123 and 124. First and second pre-heating lines 123 and 124 have widths 131 and 132, respectively, that are generally greater than width 133 of the fuse part 125. Pre-heating line 123 is in a direct physical connection with the anode 122, and pre-heating line 124 is in a direct physical connection with the cathode 121. First and second connection portions 126 and 127 serve to connect the first and second pre-heating lines 123 and 124, respectively, to the fuse portion 125. In this regard, the first and second connections portions 126 and 127 may be in a generally perpendicular arrangement with respect to the first and second pre-heating portions 123 and 124 and the fuse part 125.

Programming of the e-fuse includes forming a potential difference between the cathode 121 and the anode 122 to apply a program current via the fuse part 125. In the e-fuse 110 depicted in FIG. 1, during operation thereof, current enters at the cathode 121, travels through the second pre-heating line 124, then through the second connection portion 127 to the fuse part 125, then through the first connection portion 126 to the first pre-heating line 123, and finally out through the anode 122. The flow of current causes an increase in temperature of the first and second pre-heating lines 123 and 124. Given the parallel arrangement of the first and second pre-heating lines 123 and 124 with respect to the fuse part 125, some of the heat from first and second pre-heating lines 123 and 124 migrates to the fuse part 125 to supply heat to the fuse part 125. Heat is also generated in the fuse part 125 by virtue of the current flowing therethrough. As noted above, the fuse part 125 has a smaller width than either of the first or second pre-heating lines 123, 124. Accordingly, greater resistance, and thus greater heat, is generated by the current therein, as compared to the wider first and second pre-heating lines 123 and 124. This current-generated heat, coupled with the heat that migrates from the first and second pre-heating lines 123 and 124 causes the fuse part 125 to "blow" when the program current is applied. In contrast, due to their greater widths and lower resistances, sufficient heat is not generated in the first and second pre-heating lines 123 and 124 to cause them to blow.

The e-fuse 110 as illustrated in FIG. 1 may be formed on the basis of the following processes. The general geometric configuration of the e-fuse 110 may be defined by well-established process techniques, which may include sophisticated deposition, lithography, patterning, and fill techniques, followed by the removal of any excess materials. The material for the e-fuse 110 may include a conductive silicon material, a metal, or a metal silicide. For example, with regard to embodiments including a metal silicide e-fuse, at any appropriate manufacturing stage, a refractory metal, such as nickel, cobalt, platinum and the like, may be provided on the basis of well-established deposition techniques, and subsequently a heat treatment may be performed to initiate a chemical reaction with the silicon contained in the semiconductor base material. Thereafter, any excess metal may be removed and any optional heat treatments may be performed to thermally stabilize the resulting metal silicide material. A suitable lithographic mask may be provided so as to define the lateral size and position of areas of the electronic fuse 110 in which the metal silicide is to be provided.

Subsequent to the processes described above, the integrated circuit 100 may be completed in the convention manner including, for example, interconnecting the semiconductor device to external circuitry using soldered bump that has been deposited onto the semiconductor device. As such, all conventional post-processing steps as are known in the art are intended to be included within the scope of the present disclosure.

Figure 2A:
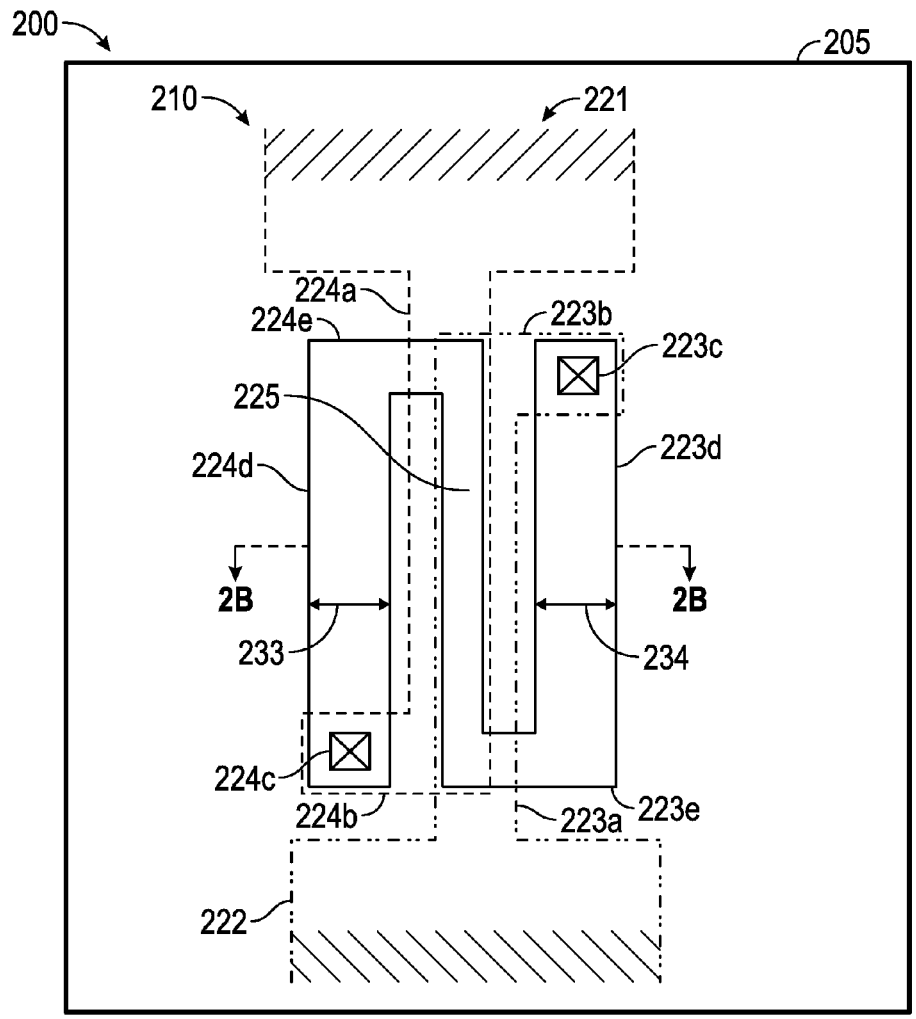
FIGS. 2A and 2B, provide top and cross-sectional views, respectively, of another embodiment of an integrated circuit including an e-fuse structure.
Figure 2B:
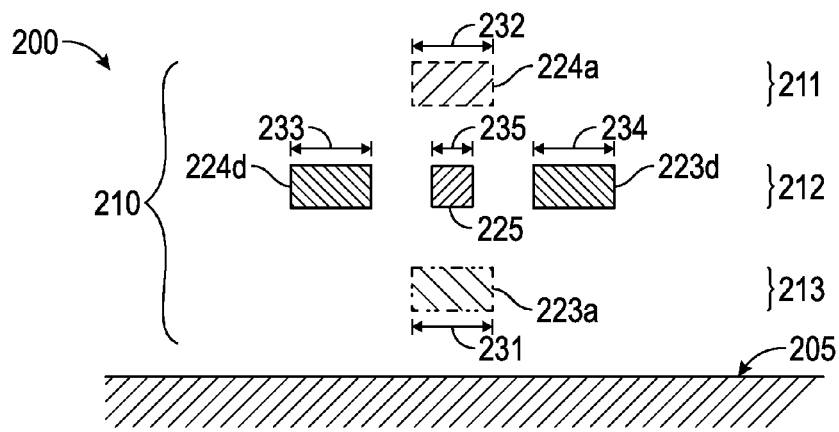

Reference is now made to FIGS. 2A and 2B, which provide top and cross-sectional views, respectively, of another embodiment of an integrated circuit including an e-fuse structure. In contrast to the embodiment shown in FIG. 1, which is provided in a single wiring layer, the embodiment shown in FIGS. 2A and 2B is provided in three wiring layers. The fuse part 225 is provided in the second or "middle" of the three wiring layers. Four pre-heating lines are provided: one below the fuse part 225 (pre-heating line 223a), one above the fuse part 225 (pre-heating line 224a), and one each on either side (within the same wiring layer) of fuse part 225 (pre-heating lines 223d and 224d). All four pre-heating lines are provided in a generally parallel arrangement (above, below, or to the side) with respect to the fuse part 225 to provide heat to the fuse part 225 during programming thereof. All four pre-heating lines have widths 231-234 that are greater than the width 235 of the fuse part 225.

Programming of the e-fuse 210 again includes applying a potential difference between the cathode 221 and the anode 222, thereby allowing current to flow through the e-fuse 210 (it is also noted that the anode may be element 221 and the cathode may be element 222, in which case the following description of current flow will be the reverse; either configuration is possible in this embodiment). Current enters the cathode 221 at the top wiring level 211 of the e-fuse 210, and travels through pre-heating line 224a, also in the top wiring level 211 of the e-fuse 210. A perpendicularly-oriented connection portion 224b directs the current to a via 224, which carries the current down to the middle wiring level 212, where it enters pre-heating line 224d. A further connection portion 224e, oriented perpendicularly to the pre-heating line 224d, allows the current to then enter the fuse part 225. From the fuse part 225, the current travels through perpendicularly-oriented connection portion 223e to pre-heating line 223d, still in the middle wiring level 212. A further via 223c then carries the current down to the lower wiring level 213, where perpendicularly-oriented connection portion 223b directs the current to the pre-heating line 223a in the lower wiring level 213 below the fuse part 225. The current then exits through the anode 222, also in the lower wiring level 213.

Given the parallel arrangement of all four pre-heating lines 223a, 223d, 224a, and 224d, with respect to the fuse part 225, some of the heat from the pre-heating lines migrates to the fuse part 225 to supply heat to the fuse part 225. Heat is also generated in the fuse part 225 by virtue of the current flowing therethrough. As noted above, the fuse part 225 has a smaller width 235 than any of the pre-heating lines (231-234). Accordingly, greater resistance, and thus greater heat, is generated by the current therein, as compared to the wider pre-heating lines. This current-generated heat, coupled with the heat that migrates from the pre-heating lines, causes the fuse part 225 to "blow" when the program current is applied. In contrast, due to their greater widths and lower resistances, sufficient heat is not generated in the pre-heating lines 223a, 223d, 224a, and 224d to cause them to blow.

Figure 3A:
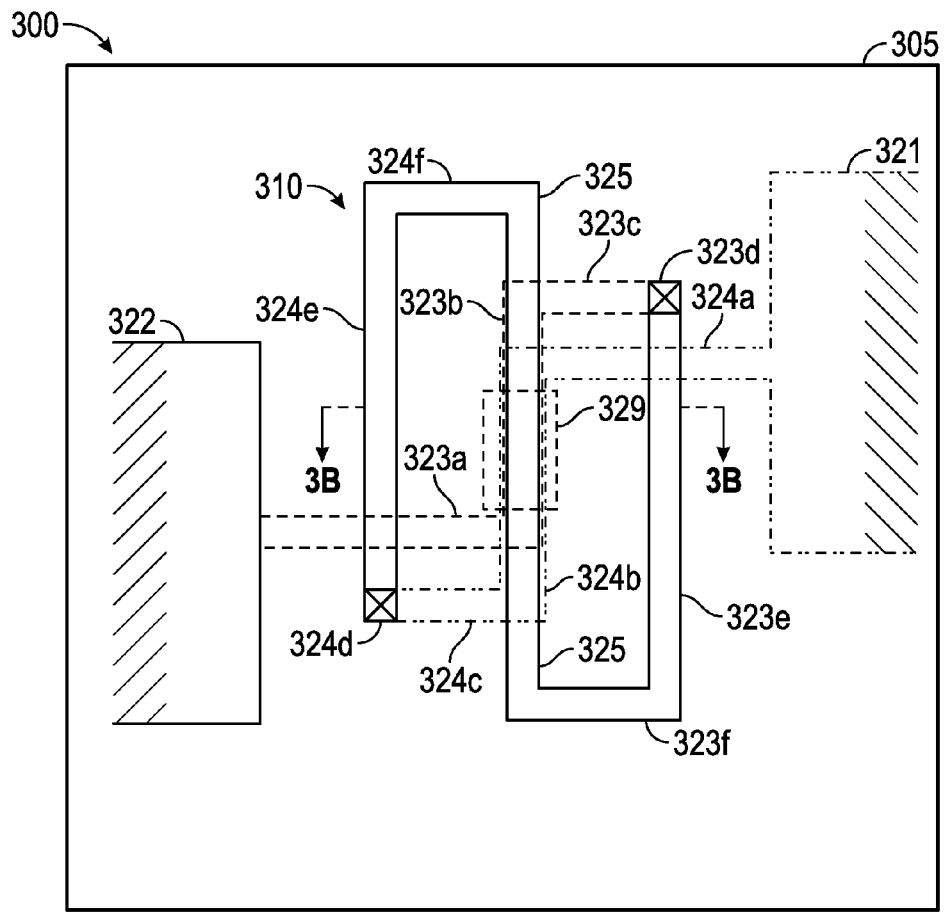
FIGS. 3A and 3B provide top and cross-sectional views, respectively, of yet another embodiment of an integrated circuit including an e-fuse structure.
Figure 3B:
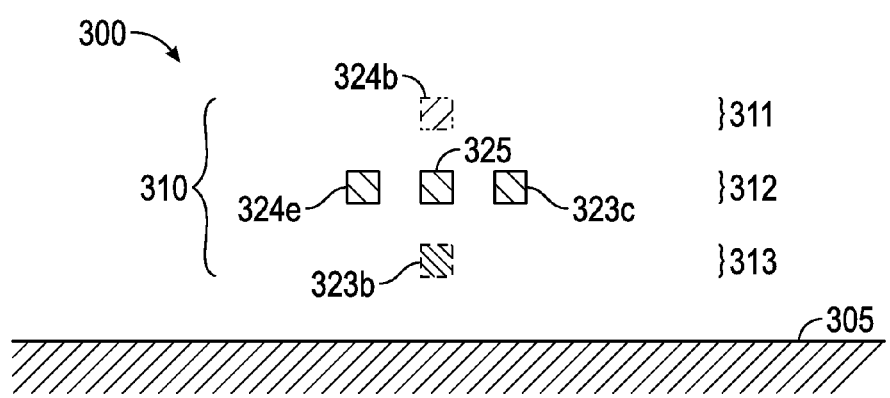

FIGS. 3A and 3B provide top and cross-sectional views, respectively, of yet another embodiment of an integrated circuit 300 including an e-fuse structure 310. This embodiment is similar to the embodiment shown in FIGS. 2A and 2B in that the e-fuse 310 is provided in three wiring levels, but differs with the use of off-set top and bottom pre-heating lines to concentrate the heat provided to the fuse part 325 at a central portion 329 of the fuse part 325, thereby increasing blow efficiency. In this embodiment, the upper wiring level 311 includes the cathode 321, a connection portion 324a connecting the cathode to a pre-heating line 324b, and a further connection portion 324c connecting to a via 324d. The connection portions 324a, 324c are oriented perpendicularly with respect to the pre-heating line 324b. Likewise, the lower wiring level 313 includes the anode 322, a connection portion 323a connecting the anode to a pre-heating line 323b, and a further connection portion 324c connecting to a via 324d. Pre-heating lines 323b and 324b are provided generally parallel to the fuse part 325, located in the middle wiring level 312. Connection portions 324a/323c and 324c/323a are laterally off-set from one another when viewed from above, as shown in FIG. 3A. This lateral offset causes the pre-heating lines 323b and 324b to overlap vertically with one another and the fuse part 325 in a central portion 329 of the fuse part 325. This configuration, as noted above, causes heat to focus on the central portion 329, thus increases blow efficiency. Additionally, similar to the embodiment shown in FIGS. 2A and 2B, e-fuse 310 includes two additional pre-heating lines 323e and 324e located in the same middle wiring level 312 as the fuse part 325, and parallel thereto. As shown, pre-heating line 324e connects to the via 324d, and to the fuse part 325 with perpendicular connection portion 324f. Likewise, pre-heating line 323e connects to the via 323d, and to the fuse part 325 with perpendicular connection portion 323f.

Accordingly the present disclosure provides various embodiments of integrated circuit structures that employ an e-fuse pre-heating arrangement in the proximity of the e-fuse in order to ensure sufficient reliability given the smaller length. The e-fuse pre-heating arrangement may be provided in the form of active support lines in the proximity of the e-fuse, for example, on either side of the e-fuse, or above or below the e-fuse. The pre-heating arrangement serves two functions: (1) they support the lithographic process for the patterning of the e-fuse (which as noted above has previously been performed by inactive support lines); and (2) they provide heat to the e-fuse, which in turn allows for a sufficient increase of total resistance in the e-fuse to cause the e-fuse to blow when desired. As such, e-fuses with a reduced footprint area but with consistent reliability may be realized.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronic fuse structure disposed in a generally planar metallization layer being defined by a first axis and a second axis that is perpendicular to the first axis, the electronic fuse structure comprising:
    a fuse part, wherein the fuse part has a length in the first axis and width in the second axis, wherein the length of the fuse part exceeds the width of the fuse part;
    first and second pre-heating lines each having a length in the first axis and a width in the second axis, wherein the length of each of the first and second pre-heating lines exceeds the width of each of the first and second pre-heating lines, wherein the width of each of the first and second pre-heating lines exceeds the width of the fuse part, and wherein the first and second pre-heating lines are positioned generally parallel to and co-planar with the fuse part, and electrically connected with the fuse part;
    first and second connecting portions physically and electrically connecting the first and second pre-heating lines, respectively, to the fuse part, wherein the first and second connecting portions are oriented generally perpendicular to the first and second pre-heating lines and the fuse part;
    a cathode physically and electrically connected to the first pre-heating line, wherein the first pre-heating line extends a distance in the first axis that is beyond the fuse part and beyond the second connecting portion, such that the first pre-heating line physically connects with the cathode at a position in the first axis that is beyond the fuse part and beyond the second connecting portion, and wherein the cathode has a width in the second axis that is sufficient to extend beyond the width of the fuse part in the second axis; and
    an anode physically and electrically connected to the second pre-heating line, wherein the second pre-heating line extends a distance in the first axis that is beyond the fuse part and beyond the first connecting portion, such that the second pre-heating lines physically connects with the anode at a position in the first axis that is beyond the fuse part and beyond the first connecting portion, and wherein the anode has a width in the second axis that is sufficient to extend beyond the width of the fuse part in the second axis.

2. The electronic fuse structure of claim 1, wherein the fuse part and the first and second pre-heating lines comprise a conductive material.

3. The electronic fuse structure of claim 2, wherein the conductive material comprises a silicon material, a metal material, or a metal silicide material.

4. The electronic fuse structure of claim 1, further comprising third and fourth pre-heating lines positioned generally parallel to and co-planar with the fuse part, and electrically connected with the fuse part.

5. The electronic fuse structure of claim 4, wherein the first and second pre-heating lines are not coplanar with the third and fourth pre-heating lines.

6. The electronic fuse structure of claim 4, further comprising third and fourth connecting portions physically and electrically connecting the third and fourth pre-heating lines, respectively, to the fuse part.

7. The electronic fuse structure of claim 6, wherein each of the third and fourth connecting portions comprise a via structure.

8. The electronic fuse structure of claim 6, wherein the third and fourth connecting portions are oriented generally perpendicular to the first, second, third, and fourth pre-heating lines and the fuse part.

9. The electronic fuse structure of claim 4, wherein each of the third and fourth pre-heating lines has a width that is greater than a width of the fuse part.

10. The electronic fuse structure of claim 4, wherein each of the third and fourth pre-heating lines overlap an entirety of the fuse part.

11. The electronic fuse structure of claim 4, wherein the third and fourth pre-heating lines and the fuse part overlap one another at a central portion of the fuse part.

12. An integrated circuit structure comprising:
    a semiconductor substrate;
    an active circuit device disposed on and/or in the semiconductor substrate; and
    a first wiring level overlying the active circuit device, wherein the first wiring level comprises an electronic fuse structure disposed in a generally planar metallization layer being defined by a first axis and a second axis that is perpendicular to the first axis, the electronic fuse structure comprising:
        a fuse part, wherein the fuse part has a length in the first axis and width in the second axis, wherein the length of the fuse part exceeds the width of the fuse part;
        first and second pre-heating lines each having a length in the first axis and a width in the second axis, wherein the length of each of the first and second pre-heating lines exceeds the width of each of the first and second pre-heating lines, wherein the width of each of the first and second pre-heating lines exceeds the width of the fuse part, and wherein the first and second pre-heating lines are positioned generally parallel to and co-planar with the fuse part, and electrically connected with the fuse part;

first and second connecting portions physically and electrically connecting the first and second pre-heating lines, respectively, to the fuse part, wherein the first and second connecting portions are oriented generally perpendicular to the first and second pre-heating lines and the fuse part;

a cathode physically and electrically connected to the first pre-heating line, wherein the first pre-heating line extends a distance in the first axis that is beyond the fuse part and beyond the second connecting portion, such that the first pre-heating line physically connects with the cathode at a position in the first axis that is beyond the fuse part and beyond the second connecting portion, and wherein the cathode has a width in the second axis that is sufficient to extend beyond the width of the fuse part in the second axis; and an anode physically and electrically connected to the second pre-heating line, wherein the second pre-heating line extends a distance in the first axis that is beyond the fuse part and beyond the first connecting portion, such that the second pre-heating lines physically connects with the anode at a position in the first axis that is beyond the fuse part and beyond the first connecting portion, and wherein the anode has a width in the second axis that is sufficient to extend beyond the width of the fuse part in the second axis.

13. The integrated circuit structure of claim 12, wherein each of the first and second pre-heating lines has a width that is greater than a width of the fuse part.

14. The integrated circuit structure of claim 12, further comprising first and second connecting portions physically and electrically connecting the first and second pre-heating lines, respectively, to the fuse part.

15. The integrated circuit structure of claim 12, further comprising third and fourth pre-heating lines positioned generally parallel to and co-planar with the fuse part, and electrically connected with the fuse part.

16. The integrated circuit structure of claim 15, wherein the first pre-heating line is positioned in a second wiring level above the first wiring level, and wherein the third pre-heating line is position in a third wiring level below the first wiring level.

* * * * *